United States Patent
Kumai (10) Patent No.: US 10,096,556 B2
(45) Date of Patent: Oct. 9, 2018

(54) SEMICONDUCTOR DEVICE

(71) Applicant: TOSHIBA MEMORY CORPORATION, Minato-ku, Tokyo (JP)

(72) Inventor: Takayuki Kumai, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 9 days.

(21) Appl. No.: 15/409,786

(22) Filed: Jan. 19, 2017

(65) Prior Publication Data
US 2017/0338187 A1   Nov. 23, 2017

(30) Foreign Application Priority Data
May 20, 2016   (JP) ................. 2016-101542

(51) Int. Cl.
| | |
|---|---|
| H01L 23/00 | (2006.01) |
| H01L 29/04 | (2006.01) |
| H01L 29/16 | (2006.01) |
| H01L 23/544 | (2006.01) |
| H01L 23/58 | (2006.01) |

(52) U.S. Cl.
CPC .......... *H01L 23/562* (2013.01); *H01L 23/544* (2013.01); *H01L 23/585* (2013.01); *H01L 29/045* (2013.01); *H01L 29/16* (2013.01); *H01L 2223/5446* (2013.01)

(58) Field of Classification Search
USPC ........................................ 257/620
See application file for complete search history.

(56) References Cited

U.S. PATENT DOCUMENTS

| | | | |
|---|---|---|---|
| 5,789,302 A * | 8/1998 | Mitwalsky | H01L 21/78 257/E21.599 |
| 6,271,578 B1 * | 8/2001 | Mitwalsky | H01L 21/78 257/618 |
| 7,417,304 B2 | 8/2008 | Tsutsue | |
| 8,008,750 B2 * | 8/2011 | Kaltalioglu | H01L 21/78 257/620 |
| 2009/0166810 A1 * | 7/2009 | Stillman | H01L 23/562 257/620 |
| 2010/0072578 A1 | 3/2010 | Kunishima | |
| 2014/0054645 A1 * | 2/2014 | Saito | H01L 29/0696 257/139 |
| 2017/0110529 A1 * | 4/2017 | Zhang | H01L 27/3276 |

FOREIGN PATENT DOCUMENTS

| | | |
|---|---|---|
| JP | S62-105446 A | 5/1987 |
| JP | 2005-302958 A | 10/2005 |
| JP | 2008-028139 A | 2/2008 |

* cited by examiner

*Primary Examiner* — Moazzam Hossain
*Assistant Examiner* — Lawrence Tynes, Jr.
(74) *Attorney, Agent, or Firm* — Foley & Lardner LLP (57) ABSTRACT

A semiconductor device includes a substrate and a conductive layer. The substrate has an upper surface that is a substantially rectangular shape having a pair of two sides extending in a first direction and a pair of two sides extending in a second direction. The conductive layer is provided on the substrate and extending along a periphery of the substrate. The conductive layer extends and zigzags toward the first direction.

15 Claims, 7 Drawing Sheets

SEMICONDUCTOR DEVICE

CROSS-REFERENCE TO RELATED APPLICATION

This application claims the benefit of and priority to Japanese Patent Application No. 2016-101542, filed May 20, 2016, the entire contents of which are incorporated herein by reference.

FIELD

Embodiments described herein relate generally to a semiconductor device.

BACKGROUND

It is known that crack stoppers are provided around the semiconductor devices.

SUMMARY

In some embodiments according to one aspect, a semiconductor device may include a substrate and a conductive layer. The substrate may have an upper surface that is a substantially rectangular shape having a pair of two sides extending in a first direction and a pair of two sides extending in a second direction. The conductive layer may be provided on the substrate and extending along a periphery of the substrate. The conductive layer may extend and zigzag toward the first direction.

In some embodiments according to another aspect, a semiconductor device may include a substrate and a conductive layer. The substrate may have an upper surface that is a substantially rectangular shape having a pair of two sides extending in a first direction and a pair of two sides extending in a second direction. The conductive layer may be provided on the substrate and extending along a periphery of the substrate. The conductive layer may include a plurality of first portions extending in a third direction and a plurality of second portions extending in a fourth direction.

Other aspects and embodiments of the disclosure are also encompassed. The foregoing summary and the following detailed description are not meant to restrict the disclosure to any particular embodiment but are merely meant to describe some embodiments of the disclosure.

DETAILED DESCRIPTION

An object of some embodiments is to provide a highly reliable semiconductor device.

According to some embodiments, a semiconductor device includes a substrate and a conductive layer. The substrate has an upper surface that is a substantially a rectangular shape having a pair of two sides extending in a first direction and a pair of two sides extending in a second direction. The conductive layer is provided on the substrate and extends along a periphery of the substrate. The conductive layer extends and zigzags toward the first direction.

Hereinafter, embodiments will be described with reference to the accompanying drawings.

In the following description, components with substantially the same functionalities and configurations will be referred to with the same reference numeral, and repeated description may be omitted. Moreover, all descriptions for a particular embodiment are also applicable as descriptions for another embodiment unless stated otherwise. In the figures, the number, the thickness, the width, the ratio of each element may differ from actual ones.

Moreover, in the following description, the expression of angle or perpendicular includes a variation according to manufacturing embodiments. That means, 85 to 95 degrees are included in "perpendicular" in this specification. And, 40 to 50 degrees are also included in "45 degrees" in this specification.

Figure 1A:
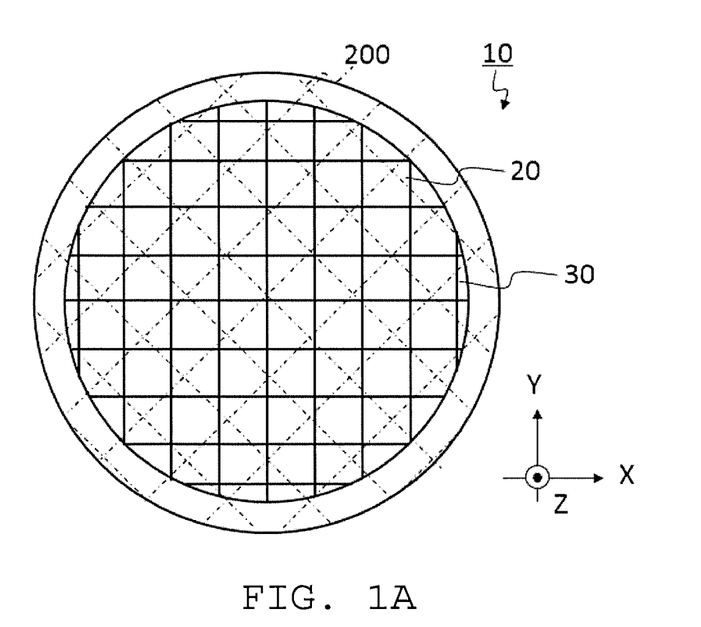
FIG. 1A is a schematic plan view of a semiconductor wafer according to some embodiments.

FIG. 1A is a schematic plan view of a semiconductor wafer 10 according to some embodiments. The semiconductor wafer has a plurality of semiconductor devices 20 on its surface. The semiconductor devices 20 have kerf regions on its peripheral. A plurality of kerf region 30 are provided in a lattice shape.

An extending direction of a kerf region 30 is defined as X-direction. Another extending direction is defined as Y-direction. For example, X-direction and Y-direction are perpendicular each other. A direction perpendicular both of X-direction and Y-direction is defined as a Z-direction. That means Z-direction is perpendicular to a surface of the semiconductor wafer 10.

In some embodiments, the semiconductor wafer 10 includes a mono-crystal of silicon. For example, a crystal orientation of the mono-crystal along Z-direction is (001). That is, a surface of the semiconductor wafer 10 is parallel to a crystal plane (001).

In some embodiments, the crystal orientations (100), (010) are crossing to X-direction and Y-direction. For example, crystal orientations (100), (010) are inclined at about 45 degrees to X-direction and Y-direction, respectively. In other words, crystal planes (100) and (010) are inclined at about 45 degrees to X-direction and Y-direction respectively.

In FIG. 1A, the crystal planes (100) and (010) are referred to as a crystal plane 200 without distinction. Since the crystal plane 200 is hardly visible with naked eyes, the crystal plane 200 shown in FIG. 1A is drawn for the sake of convenience. In the following figures, the crystal plane 200 is only drawn when it is necessary for the explanation.

Figure 1B:
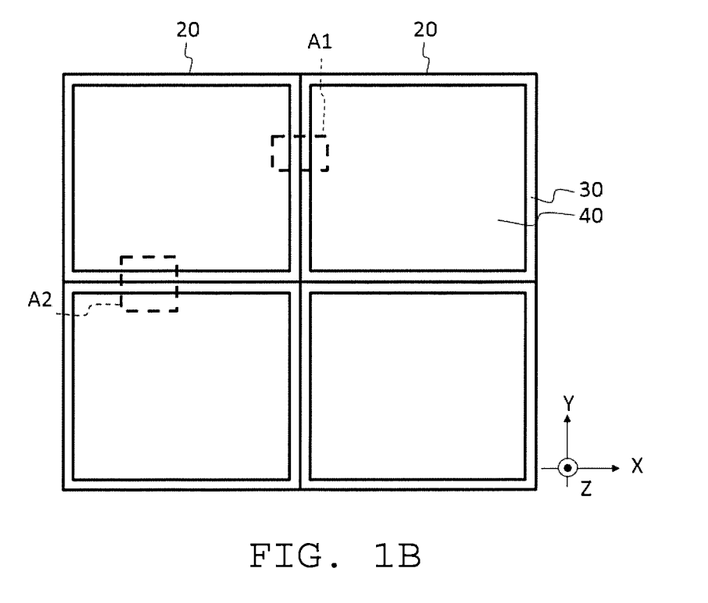
FIG. 1B is an enlarged schematic plan view of a part of the semiconductor wafer according to some embodiments.

FIG. 1B is an enlarged figure for the explanation of the semiconductor wafer 10 according to some embodiments. The crystal planes (100) and (010) are referred to as a crystal plane 200 without distinction. FIG. 1B shows a plan view of enlarged four semiconductor devices 20.

In some embodiments, each of the semiconductor devices 20 has a kerf region 30 and a device region 40 respectively. The kerf region 30 is a periphery of a semiconductor device 20. A detail of the kerf region 30 will be described later. The device region 40 is a region other than the kerf region 30, provided as an inner region inside the kerf region 30.

Figure 2A:
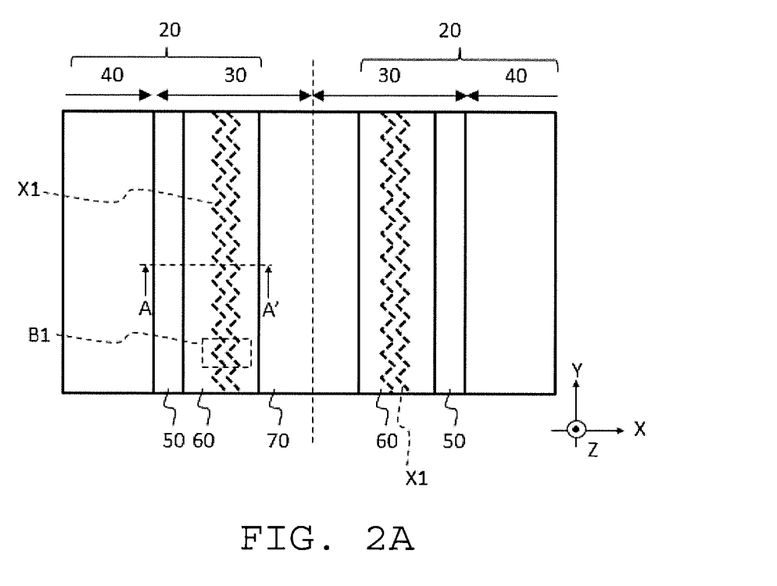
FIG. 2A is an enlarged schematic plan view of a region A1 in FIG. 1B.
Figure 2B:
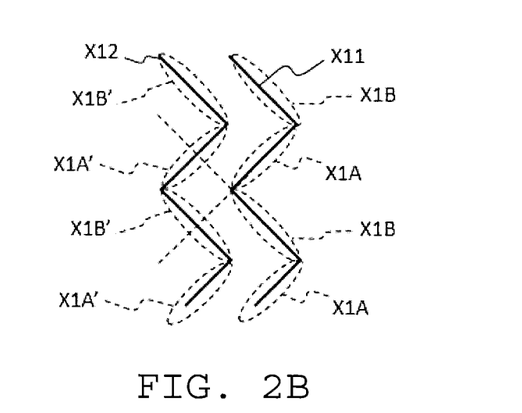
FIG. 2B is an enlarged schematic plan view of a region B1 in FIG. 2A, illustrating a layout of pattern X1.

FIG. 2A is a schematic plan view showing the region A1 in FIG. 1B. FIG. 2B is a schematic plan view showing the region B1 in FIG. 2A. Also, for the convenience of explanation, a pattern X1 is drawn in a dotted line in FIG. 2A and in a solid line in FIG. 23.

A kerf region 30 shown in FIG. 2A will be described. In some embodiments, a kerf region 30 of one of the semiconductor devices 20 is adjacent to a kerf region 30 of other semiconductor device 20. The kerf region 30 has a guard ring region 50, a crack stopper region 60 and a dicing line region 70. Each region 50, 60 or 70 extends along a same direction as the kerf region 30. Each kerf region 30 extends along a periphery of the semiconductor device 20 (see FIG. 1B). In other words, each of kerf regions 30 extends in a direction in which an edge of the semiconductor device 20 extends. In FIG. 2A and the region A1 in FIG. 13, the kerf region 30 extends in Y-direction. In a region A2 in FIG. 1B, the kerf region 30 extends in X-direction. Additionally, although the boundaries of each region are clearly drawn in FIG. 2A, it is not necessary that these boundaries are clear.

The guard ring region 50 has, for example, a conductive layer (not drawn in FIG. 2A) extending along the periphery of the semiconductor device 20 (see FIG. 1B).

In some embodiments, the dicing line region 70 is provided so as to overlap the plurality of the semiconductor devices 20. In some embodiments, the dicing line region 70 is adjacent at least two kerf regions 30 of different semiconductor devices 20.

In some embodiments, the dicing line region 70 is a region separated when dicing is performed. The dicing is an operation by which the semiconductor devices 20 on the semiconductor wafer 10 are separated. The dicing line region 70 is cut, for example, with a dicing blade. During the dicing operation, the dicing line region 70 may be separated by cleaving. Moreover, before the cleaving, the dicing line region 70 may be heated by a laser.

In some embodiments, the crack stopper region 60 is a region that lowers the possibility that chipping reaches to the device region 40 when the dicing operation is performed. The chipping is a crack occurring in the edge of the semiconductor device 20 because of a shock during the dicing operation.

In some embodiments, the crack stopper region 60 has a pattern X1 (see FIG. 2A).

A material or a structure of the pattern X1 will be described with reference to FIG. 3. In some embodiments, the pattern X1 includes one of a substrate inner insulation layer 110, a first conductor layer 120, a second conductor layer 130, a third conductor layer 140, a fourth conductor layer 150, a fifth conductor layer 160, a sixth conductor layer 170, a seventh conductor layer 180, or a plurality of layers thereof (see FIG. 3).

There are two patterns in the pattern X1 provided in a crack stopper region 60 in FIG. 2A. When the (whole) pattern X1 extends in Y-direction as a whole, the two patterns in the pattern X1 are provided (or spaced) separately in X-direction (see FIG. 2A). In some embodiments, when the pattern X1 extends in X-direction as a whole, two patterns of the pattern X1 can be provided (or spaced) separately in Y-direction.

The detail of pattern X1 is described by FIG. 2B. The two patterns X1 are now referred to as a pattern X11 and a pattern X12, respectively.

The pattern X11 is provided, for example, in a zigzag shape toward the direction in which the crack stopper region 60 extends (e.g., in Y-direction as shown in FIG. 2A). In some embodiments, the pattern X11 extends and zigzags toward the direction in which the crack stopper region 60 extends (e.g., in Y-direction as shown in FIG. 2A). In some embodiments, the pattern X11 alternately extends from left to right or from right to left toward Y-direction, while concurrently the pattern X11 extends in Y-direction as a whole.

In some embodiments, as shown in FIG. 2B, the pattern X11 has portions X1A and X1B alternatively.

In some embodiments, as shown in FIG. 2B, the portion X1A and the portion X1B extend respectively in directions crossing X-direction and Y-direction. For example, the portion X1A extends in a direction having an angle of 45 degrees from X-direction and Y-direction, and the portion X1B extends in a direction having an angle of 45 degrees from X-direction and Y-direction. Also, an extending direction of the portion X1A and an extending direction of the portion X1B cross each other (for example perpendicularly).

In other words, referring to FIG. 2B, the pattern X11 extends in Y-direction as a whole, alternately extending in a first direction crossing X-direction and Y-direction and in a second direction crossing to X-direction, Y-direction and the first direction. In pattern X11, a portion extending in the first direction is the portion X1A and a portion extending in the second direction is the portion X1B.

Similarly, in some embodiments, the pattern X12 includes a portion X1A' and a portion X1B' (see FIG. 2B). The portion X1A is substantially parallel to the portion X1A' and The portion X1B is substantially parallel to the portion X1B'.

In some embodiments, referring to FIG. 23, the patterns X11 and X12 are provided as follows. The extending direction of the portion X1B (or an extended line thereof) crosses (or passes through) a center position of the portion X1A'. Similarly, the extending direction of the portion X1A (or an extended line thereof) crosses (or passes through) the center position of the portion X1B'.

In some embodiments, the pattern X1 may include more than three patterns. In some embodiments, the pattern X1 may include two (e.g., X11 and X12 as shown in FIG. 2B) or more patterns.

Figure 3:
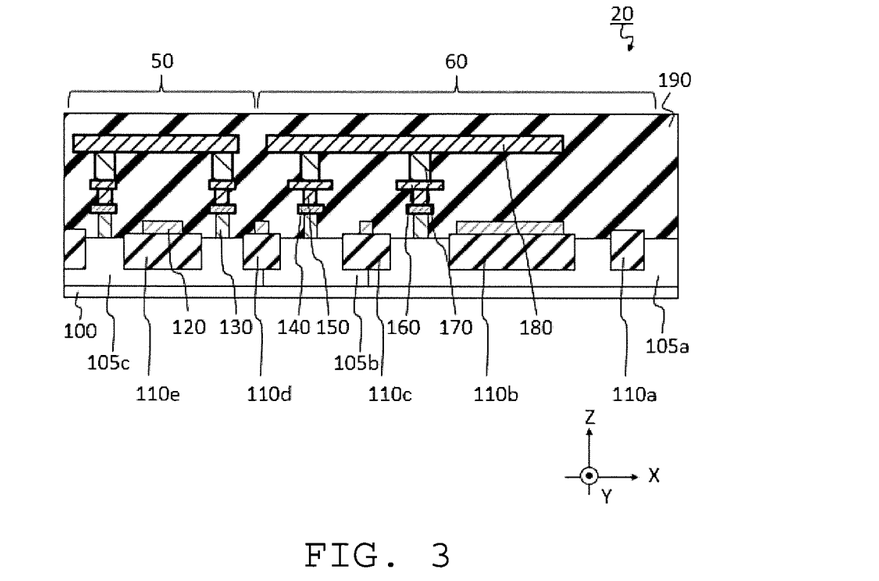
FIG. 3 is a schematic cross-sectional view taken along line A-A' in FIG. 2A.

FIG. 3 is a schematic cross-sectional view taken along line A-A' in FIG. 2A.

In some embodiments, the semiconductor device 20 has a structure (described as follows) in the guard ring region 50 and the crack stopper region 60.

In some embodiments, the semiconductor device 20 has a semiconductor substrate 100, a substrate inner insulation layer 110, a first conductor layer 120, a second conductor layer 130, a third conductor layer 140, a fourth conductor layer 150, a fifth conductor layer 160, a sixth conductor layer 170, a seventh conductor layer 180 and a interlayer insulating layer 190.

In some embodiments, the semiconductor substrate 100 has impurity regions 105a, 105b, 105c in an upper region (of the semiconductor substrate 100). When the impurity regions 105*a*, 105*b*, 105*c* are not distinguished from each other, the impurity regions 105*a*, 105*b*, 105*c* is collectively referred to as the impurity region 105.

In some embodiments, the impurity type of the impurity region 105*a* is the same as that of the impurity region 105*c* (e.g., a p-type impurity region). In some embodiments, the impurity type of the impurity region 105*b* is different from that of the impurity region 105*a*. For example, the impurity region 105*b* is an n-type impurity region.

In some embodiments, substrate inner insulation layer 110*a*, 110*b*, 110*c*, 110*d*, 110*e* are provided in a trench or hole on an upper portion of the semiconductor 100. When the substrate inner insulation layer 110*a*, 110*b*, 110*c*, 110*d*, 110*e* are not distinguished from each other, the substrate inner insulation layer 110*a*, 110*b*, 110*c*, 110*d*, 110*e* are collectively referred to as the substrate inner insulation layer 110. The upper portion of the substrate inner insulation layer 110 protrudes, for example, above an upper surface of the semiconductor substrate 100. In some embodiments, the substrate inner insulation layer 110 protrudes from the impurity region 105 above the upper surface of the semiconductor substrate 100 (see FIG. 3). The substrate inner insulation layer 110 includes silicon dioxide, for example.

In some embodiments, as shown in FIG. 3, the first conductive layer 120 is provided on the substrate inner insulation layer 110 or the semiconductor substrate 100. In some embodiments, the first conductive layer 120 extends in Y-direction as a whole (see FIG. 3). In some embodiments, as shown in FIG. 3, the first conductive layer 120 is provided directly on the inner insulation layer 100. The position of the first conductive layer 120 is not limited to this position. In some embodiments, the first conductive layer 120 may be provided on the substrate 100 via a gate insulating layer. In some embodiments, the first conductive layer 120 comprises silicon, metal or alloy thereof. More specifically, the metal is, for example, tungsten, nickel, titan, titan nitride, cobalt or alloy thereof.

In some embodiments, the first insulation layer 120 is the pattern X1. That is, the first insulation layer 120 extends in Y-direction as a whole, while concurrently extending at least in a first direction crossing Y-direction (e.g., X1A in FIG. 2B) and in a second direction crossing the first direction (e.g., X1B in FIG. 2B), alternately.

In some embodiments, the second conductive layer 130 is provided on the semiconductor substrate 100. The second conductive layer 130 is extending in Y-direction as a whole. In some embodiments, the second conductive layer 130 comprises silicon, metal or alloy thereof. For example, the metal includes one of cupper, tungsten, titan, titan nitride, tantalum, tantalum nitride, or a stacked layer thereof.

In some embodiments, the second insulation layer 130 is the pattern X1. That is, the second insulation layer 130 extends in Y-direction as a whole, while concurrently extending at least in a first direction crossing Y-direction (e.g. X1A in FIG. 2B) and in a second direction crossing the first direction (X1B in FIG. 2B), alternately.

In some embodiments, the third conductive layer 140 is provided above the second conductive layer 130. The fourth conductive layer 150 is provided above the third conductive layer 140. The fifth conductive layer 160 is provided above the sixth conductive layer 170. The sixth conductive layer 170 is provided above the fifth conductive layer 160. The seventh conductive layer 180 is provided above the sixth conductive layer 170.

In some embodiments, one of the third to sixth conductive layers 140 to 170 is the pattern X1. That is, the layer corresponding to the pattern X1 extends in Y-direction as a whole, while concurrently extending at least in a first direction crossing Y-direction (e.g., X1A in FIG. 2B) and in a second direction crossing the first direction (e.g., X1B in FIG. 2B), alternately.

The third to sixth conductive layers 140 to 170 comprise, for example, silicon, metal or the alloy thereof.

In some embodiments, the interlayer insulating layer 190 is provided surrounding the elements mentioned above (e.g., the elements 100 to 180). The interlayer insulating layer 190 comprises, for example, silicon oxide, silicon nitride or the laminate layer thereof, but not limited to these as long as the material is an insulator.

Next, the relationship between the pattern X1 (see FIGS. 2A and 2B) and the above each element will be described in detail. In some embodiments, the pattern X1 comprises one of the substrate inner insulation layer 110, the first conductive layer 120, the second conductive layer 130, the third conductive layer 140, the fourth conductive layer 150, the fifth conductive layer 160, the sixth conductive layer 170 and the seventh conductive layer 180 or plurality of these layers.

In some embodiments, the pattern X1 is the substrate inner insulation layer 110. In this case, the substrate inner insulation layer 110*b* and 110*c* provided in the crack stopper region 60 form the pattern X1. That is, those layers are provided in zigzag shape, extending in Y-direction. In some embodiments, the other substrate inner insulation layer 110*a*, 110*d* or 110*e* is provided in a linear shape, extending in Y-direction.

The embodiment is not limited to the above example in which the substrate inner insulation layer 110*b* and 110*c* are provided in a zigzag shape. For example, all of the substrate inner insulation layer 110 may be provided in a zigzag shape. In some embodiments, only one of the substrate insulation layer 110 is provided in a zigzag shape.

Also, FIG. 3 shows an example in which the semiconductor devices 20 include the seven conductive layers (the first to seventh layers 120 to 180), but the embodiment is not limited to this example. In some embodiments, the semiconductor devices 20 may include less than 7 conductive layers, or more than 7 conductive layers, and one of these conductive layers may be provided in a zigzag shape like the pattern X1.

In some embodiments, one or all of the substrate inner insulation layer 110, the first conductive layer 120, the second conductive layer 130, the third conductive layer 140, the fourth conductive layer 150, the fifth conductive layer 160, the sixth conductive layer 170 and the seventh conductive layer 180 are provided in a zigzag shape.

In some embodiments, the crack stopper region 60 in the region A1 extends in Y-direction, like the region A1 in FIG. 1B.

In some embodiments, the crack stopper region 60 extends in X-direction, like the region A2 in FIG. 1B.

That is, in the region A2, the pattern X1 is provided, for example, in a zigzag shape toward a direction in which the crack stopper region 60 extends. That is, in some embodiments, the pattern X1 alternately extends left to right or right to left toward X-direction, while concurrently the pattern X1 extending in X-direction as a whole.

In some embodiments, the pattern X1 extends in X-direction as a whole, while concurrently extending in at least in a third direction crossing X-direction and in a fourth direction crossing the third direction. The third direction may or may not be the same direction as the first direction or the second direction. Similarly, the fourth direction may or may not be the same direction as the first direction or the second direction.

The effect of the embodiments illustrated in FIGS. 1A to 3 are described with reference to FIG. 4 and FIG. 5.

Figure 4:
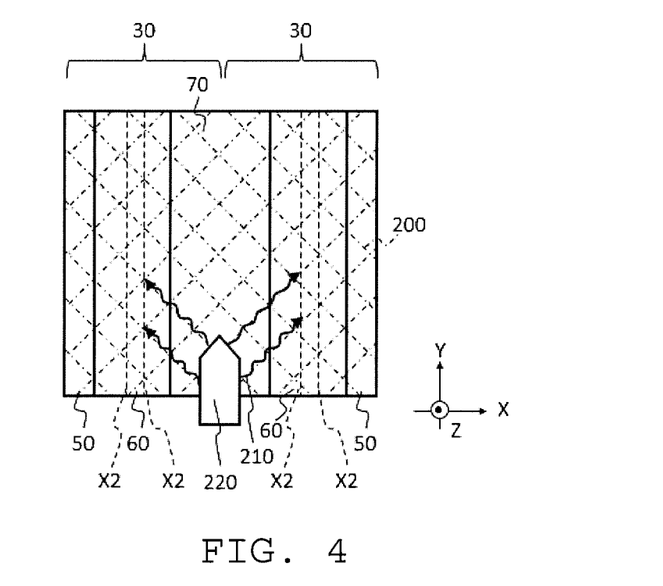
FIG. 4 is a schematic explanatory plan view which explains the condition of a semiconductor wafer according to a comparative example at a dicing timing.

FIG. 4 shows an explanatory plan view of a comparative example at a dicing timing. In the comparative example, each of the conductive layers and the substrate inner insulation layer 110 is provided in a linear shape, extending in the direction in which the crack stopper region 60 extends (e.g., Y-direction as shown in FIG. 3).

Next, a situation when the dicing line region 70 is cut by a dicing blade 220 will be described with reference to FIG. 4. When the dicing blade 220 cut the dicing line region 70, the impact of the cutting may cause a small crack 210. This crack 210 may sometimes extend along the crystal plane 200 of the semiconductor wafer 10. That is, the crack 210 may extend towards the Y-direction at an angle of about 45 degrees (with respect to the Y-direction).

In the comparative example of FIG. 4, the pattern X2 in the crack stopper region 60, which are conductive layers and the substrate inner insulation layer, is provided toward the extending direction of the crack stopper region 60 at an angle of about 45 degrees with respect to the extending direction of the crack 210. Since the extending direction of the crack 210 and the extending direction of each element of the crack stopper region 60 form a far smaller angle than 90 degrees, the crack stopper region 60 sometimes may not be able to stop the extension of the crack 210. In other words, the crack 210 sometimes may penetrate the crack stopper region 60 and reach the guard ring region 50 and the device region 40 (not shown in the figures), which may cause a failure of the semiconductor device 20.

If the crack 200 reaches the device region 40 of the semiconductor device 20, the crack may sometimes cause the deterioration of the characterization or the degradation of the reliability.

Figure 5:
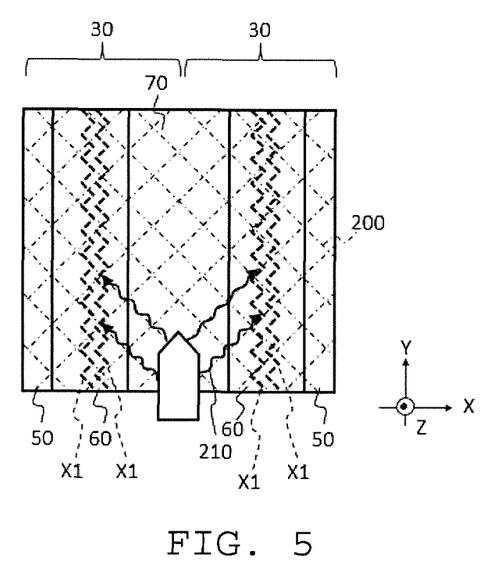
FIG. 5 is a schematic explanatory plan view which explains the condition of the semiconductor wafer according to some embodiments at a dicing timing.

FIG. 5 shows an explanatory plan view according to some embodiments at a dicing timing. In some embodiments, as shown in FIG. 5, the pattern X2 includes a portion substantially perpendicular to the extending direction of the crack 210. Since the element of the crack stopper region 60 is provided in a direction perpendicular to the extending direction of the crack 210, the crack stopper region 60 can more efficiently stop the extension of the crack 210.

That is, the crack stopper region 60 according to some embodiments can reduce the possibility that the semiconductor device 20 is damaged or failed.

According to some embodiments, the second conductive layer 130, the third conductive layer 140, the fourth conductive layer 150, the fifth conductive layer 160 and the sixth conductive layer 170, the seventh conductive layer 180 are provided in the pattern X1 and connected to each other. For example, each of element provided along the height direction (e.g., the Z-direction in FIG. 3) to the substrate form the pattern X1 towards the Y-direction (see FIG. 5). In some embodiments, all conductive layers form the pattern X1. In some embodiments, the conductive layers include a metal. In some embodiments, the conductive layers include a metal harder than silicon or insulation film like silicon oxide. That is, in some embodiments, the metal layers in the pattern X1 can prevent the cracks more effectively. Additionally, in some embodiments, the substrate inner insulation layers 110 and the first conductive layer 120 may form the pattern X1. In this case, in some embodiments, the portion of the substrate between the substrate inner insulation layers 110 forms the pattern X1 so that this portion of the substrate can contribute to stopping the cracks 210.

According to some embodiments, the pattern X1 includes two patterns (as shown in FIGS. 2A and 2B) or more than two patterns. In some embodiments, two or more than two patterns of the pattern X1 are provided separately. Therefore, if one of the patterns X1 cannot stop the extension of the crack 210, other pattern X1 can stop the extension of the crack 210, thereby increasing the possibility to stop the extension of the crack 210. In this case, in some embodiments, the seventh conductive layer 180 may be used for a bundle of a plurality of patterns of the pattern X1 (see FIG. 3).

Above-described examples can be combined. In some embodiments, each of the second conductive layer 130, the third conductive layer 140, the fourth conductive layer 150, the fifth conductive layer 160 and the sixth conductive layer 170 can have two patterns of the pattern X1. In some embodiments, one pattern of the pattern X1 in each layers is connected in Z-direction as shown in FIG. 3. In some embodiments, the seventh conductive layer 180 can bundle two patterns of the pattern X1. Additionally, the seventh conductive layer 180 may or may not form the pattern X1.

In some embodiments, the pattern X11 that is close to the dicing line region 70 in FIG. 2B includes the portion X1A and the portion X1B. In some embodiments, the extending direction of the portion X1A (or a line thereof) is crossing (or passing through) a substantially center position of the portion X1B of the other pattern X12, which is next to the pattern X11 and farther from the dicing line region 70 than the pattern X11. Similarly, in some embodiments, the extending direction of the portion X1B (or a line thereof) is crossing (or passing through) a substantially center position of the portion X1A of the other pattern X12. With this configuration, even if the crack 210 extends along the portion X1A or X1B of the pattern X11 and penetrate the pattern X11, the next pattern X12 can stop the crack 210 more effectively.

Figure 6A:
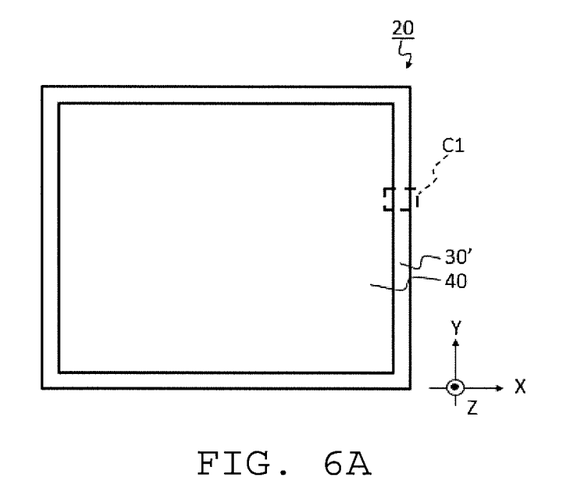
FIG. 6A is a schematic plan view of a semiconductor device according to some embodiments.
Figure 6B:
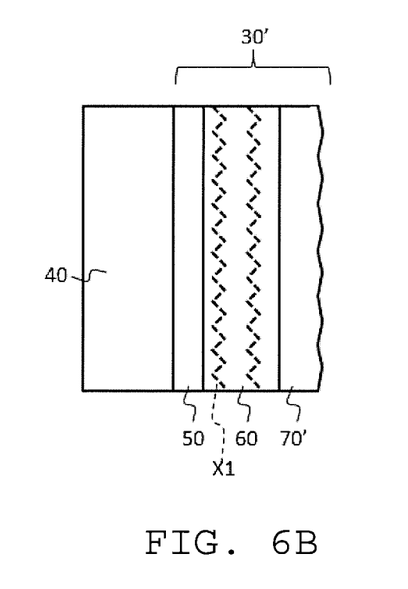
FIG. 6B is an enlarged schematic plan view of a region C1 in FIG. 6A.

FIG. 6A shows an example of a tangible semiconductor device 20 according to some embodiments. FIG. 6B shows a region C1 in FIG. 6A.

As shown in FIG. 6A and FIG. 6B, in some embodiments, the semiconductor device 20 is substantially the rectangle. That is, the semiconductor device 20 comprises four sides, which include a pair of two sides extending in X-direction and another pair of two sides extending in Y-direction (see FIG. 6A).

In some embodiments, the semiconductor 20 has a device region 40 and kerf region 30' (see FIG. 6A). In some embodiments, referring to FIG. 6B, the kerf region 30' has a guard ring region 50, a crack stopper region 60 and a dicing region 70'. The dicing region 70' is a region where the dicing operation is performed, similar to the dicing region 70 as shown in FIG. 2A.

As shown in FIG. 6A and FIG. 6B, in some embodiments, the crack stopper region 60 and the pattern X1 are provided along a periphery of the semiconductor device 20.

Figure 7A:
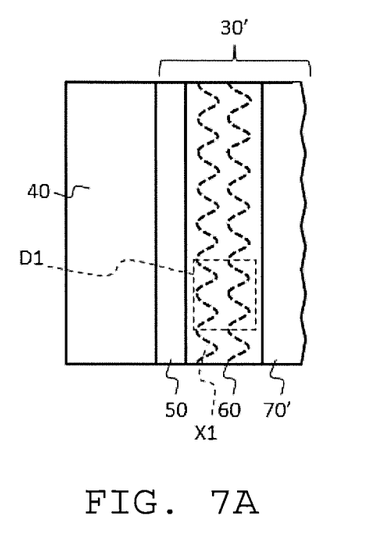
FIG. 7A is a schematic plan view of a semiconductor device according to a variation of some embodiments.
Figure 7B:
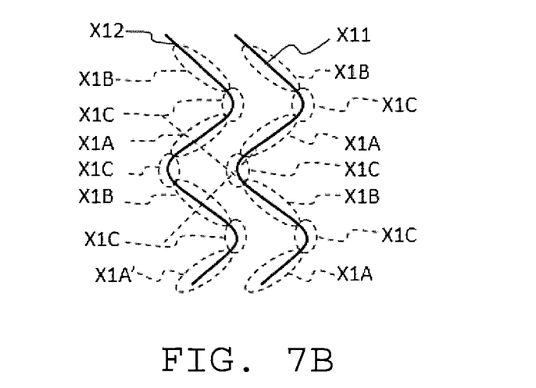
FIG. 7B is an enlarged schematic plan view of the region D1 in FIG. 7A.

FIG. 7A shows a plan view of another embodiment. FIG. 7B is an enlarged view of a region D1 in FIG. 7A. According to some embodiments, as shown in FIG. 7A, the pattern X1 curves with a curve line portion. In some embodiments, as shown in FIG. 7B, the pattern X1 has a linear portion X1A, a linear portion X1B and a curve line portion X1C. In some embodiments, the linear portion X1A connects to the linear portion X1B via the curve line portion X1C.

The curved patterns X11 and X12 as shown in FIG. 73 have a benefit of decreasing difficulties of fabrication of the insulation layer or conductive layers corresponding to the pattern X1.

Figure 8:
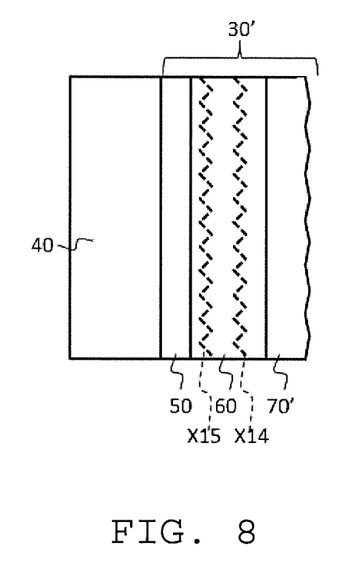
FIG. 8 is a schematic plan view of a semiconductor device according to some embodiments.

FIG. 8 shows a plan view of another embodiment.

In some embodiments, as shown in FIG. 8, the crack stopper region 60 has the pattern X14 and the pattern X15. In some embodiments, the pattern X14 corresponds to the substrate insulation layer 110. In some embodiments, the pattern X15 corresponds to at least one of the first to seventh conductive layers 120 to 180.

That is, in some embodiments, the pattern X14 and the pattern X15 corresponds to a different element.

While certain embodiments have been described, these embodiments have been presented by way of example only, and are not intended to limit the scope of the disclosure. Indeed, the embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the present disclosure.

What is claimed is:

1. A semiconductor device comprising:
a substrate having an upper surface that is a substantially rectangular shape having a pair of two sides extending in a first direction and a pair of two sides extending in a second direction;
a conductive layer provided on the substrate and extending along a periphery of the substrate, wherein the conductive layer extends and zigzags toward the first direction; and
an insulation layer provided in an upper portion of the substrate, wherein the insulation layer extends and zigzags toward the first direction,
wherein the conductive layer includes a first conductive layer and a second conductive layer, the first conductive layer being provided adjacent to the second conductive layer toward the second direction,
wherein the first conductive layer includes a first portion and a second portion, the first portion extending in a third direction crossing the first direction and the second direction, the second portion extending in a fourth direction crossing the first direction, the second direction and the third direction.

2. The semiconductor device according to the claim 1, wherein the first conductive layer includes a curve line portion between the first portion and the second portion.

3. The semiconductor device according to the claim 1, wherein the second conductive layer includes a third portion extending in the fourth direction and a fourth portion extending in the third direction, such that an extension of the first portion crosses the third portion and an extension of the second portion crosses the fourth portion.

4. The semiconductor device according to the claim 1, wherein the insulation layer includes a first insulation layer and a second insulation layer, the first insulation layer being provided adjacent to the second insulation layer toward the second direction.

5. The semiconductor device according to the claim 4, wherein the first insulation layer includes a fifth portion and a sixth portion, the fifth portion extending in a fifth direction crossing the first direction and the second direction, the sixth portion extending in a sixth direction crossing the first direction, the second direction and the fifth direction.

6. The semiconductor device according to the claim 5, wherein the first insulation layer includes a curve line portion between the fifth portion and the sixth portion.

7. The semiconductor device according to the claim 5, wherein the second insulation layer includes a seventh portion extending in the sixth direction and an eighth portion extending in the fifth direction such that an extension of the fifth portion crosses the seventh portion and an extension of the sixth portion crosses the eighth portion.

8. A semiconductor device comprising:
a substrate having an upper surface that is a substantially rectangular shape having a pair of two sides extending in a first direction and a pair of two sides extending in a second direction;
a conductive layer provided on the substrate and extending along a periphery of the substrate, wherein the conductive layer extends and zigzags toward the first direction; and
an insulation layer provided in an upper portion of the substrate, wherein the insulation layer extends and zigzags toward the first direction,
wherein the substrate includes a silicon crystal, and
a (100) direction of the silicon crystal or a 010 direction of the silicon crystal cross the first direction.

9. A semiconductor device comprising:
a substrate having an upper surface that is a substantially rectangular shape having a pair of two sides extending in a first direction and a pair of two sides extending in a second direction;
a conductive layer provided on the substrate and extending along a periphery of the substrate, wherein the conductive layer includes a plurality of first portions extending in a third direction and a plurality of second portions extending in a fourth direction; and
an insulation layer provided in an upper portion of the substrate, wherein the insulation layer includes a plurality of third portions extending in the third direction and a plurality of fourth portions extending in the fourth direction,
wherein the conductive layer includes a curve line portion between at least one of the first portions and one of the second portions.

10. The semiconductor device according to the claim 9, wherein the conductive layer includes a first conductive layer and a second conductive layer, the first conductive layer being provided adjacent to the second conductive layer toward the second direction.

11. The semiconductor device according to the claim 10, wherein an extension of one of the first portions of the first conductive layer crosses one of the second portions of the second conductive layer, and an extension of one of the second portions of the first conductive layer crosses one of the first portions of the second conductive layer.

12. The semiconductor device according to the claim 9, wherein the insulation layer includes a first insulation layer and a second insulation layer, the first insulation layer being provided adjacent to the second insulation layer toward the second direction.

13. The semiconductor device according to the claim 9, wherein the first insulation layer includes a curve line portion between the third portions and the fourth portions.

14. The semiconductor device according to the claim 12, wherein an extension of the third portion of the first insulation layer crosses the fourth portion of the second insulation layer, and an extension of the fourth portion of the first insulation layer crosses the third portion of the second insulation layer.

15. The semiconductor device according to the claim 9, wherein the substrate includes a silicon crystal, and
  a (100) direction of the silicon crystal or a (010) direction of the silicon crystal cross the first direction.

* * * * *